US012712020B2

(12) United States Patent
Zhao et al.

(10) Patent No.: US 12,712,020 B2
(45) Date of Patent: Aug. 18, 2026

(54) RECURSIVE ANALOG CONTENT ADDRESSABLE MEMORY DEVICE

(71) Applicant: Hewlett Packard Enterprise Development LP, Spring, TX (US)

(72) Inventors: Lei Zhao, Fort Collins, CO (US); Luca Buonanno, Fort Collins, CO (US); Archit Gajjar, Fort Collins, CO (US); Giacomo Pedretti, San Francisco, CA (US); James Ignowski, Fort Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 119 days.

(21) Appl. No.: 18/933,512

(22) Filed: Oct. 31, 2024

(65) Prior Publication Data

US 2026/0120766 A1 Apr. 30, 2026

(51) Int. Cl.
*G11C 15/04* (2006.01)
*G11C 27/00* (2006.01)

(52) U.S. Cl.
CPC ............ *G11C 15/046* (2013.01); *G11C 27/00* (2013.01)

(58) Field of Classification Search
CPC ........ G11C 15/046; G11C 27/00; G11C 15/00
See application file for complete search history.

(56) References Cited

U.S. PATENT DOCUMENTS 10,847,238 B2 11/2020 Li et al.
11,615,827 B2 3/2023 Graves et al.
12,106,805 B2 10/2024 Ziegler et al.
2025/0336441 A1* 10/2025 Zhao .................... G11C 27/005

OTHER PUBLICATIONS

Zhao et al., "RACE-IT: A Reconfigurable Analog CAM-Crossbar Engine for In-Memory Transformer Acceleration", Nov. 29, 2023, 13 pages.

* cited by examiner

*Primary Examiner* — Han Yang
(74) *Attorney, Agent, or Firm* — Slater Matsil, LLP

(57) ABSTRACT

A recursive Analog Content Addressable Memory (ACAM) device includes a first comparison stage and a second comparison stage. The first comparison stage includes a first match line, a first base segment comparator connected between the first match line and a reference node, a first incremented segment comparator, and a first pass transistor. The first pass transistor and the first incremented segment comparator are connected in series between the first match line and the reference node. The second comparison stage includes a first inverter connected to the first pass transistor, a second match line connected to the first inverter, and a second base segment comparator connected between the second match line and the reference node. The device enables efficient comparison of multi-bit values.

20 Claims, 7 Drawing Sheets

RECURSIVE ANALOG CONTENT ADDRESSABLE MEMORY DEVICE

BACKGROUND

Content Addressable Memory (CAM) is a type of computing memory used in high-speed searching applications. In CAM, stored data is not searched by its location, but rather by its content. An input value is supplied and the CAM searches its memory to see if that input value is stored in the memory.

Analog Content Addressable Memory (ACAM) is a type of CAM that can store a range of values in its cell, rather than a single value. This makes ACAM particularly useful for accelerating algorithms with tabular data. The ACAM cell structure can be designed to store ranges with varying levels of precision, enhancing its applicability to real-world machine learning algorithms that often require high precision. ACAMs are powerful, efficient, and fast.

BRIEF DESCRIPTION OF THE DRAWINGS

For a more complete understanding of this disclosure, and advantages thereof, reference is now made to the following descriptions taken in conjunction with the accompanying drawings, in which.

Corresponding numerals and symbols in the different figures generally refer to corresponding parts unless otherwise indicated.

DESCRIPTION

The following disclosure provides many different examples for implementing different features. Specific examples of components and arrangements are described below to simplify the present disclosure. These are, of course, merely examples and are not intended to be limiting.

An analog content-addressable memory (ACAM) may store a value and perform comparisons against input data. In an ACAM, a stored value can be compared with an input value to determine if they match or if the input value falls within a specified range. ACAMs may be implemented with memristors. However, such ACAMs face limitations in performing high-precision comparisons due to the storage capacity constraints of individual memristors. Typical memristor-based ACAMs can only store and compare a limited number of bits, which poses a challenge for applications requiring comparisons involving a large number of bits. This limitation becomes particularly problematic in advanced applications, where high-precision comparisons are needed for accurate results.

This disclosure describes a recursive ACAM device that supports comparisons of arbitrary precision. The approach involves partitioning high-precision comparison thresholds into smaller bit segments that can be stored within standard memristors. A high-precision comparison may include performing multiple low-precision comparisons on these bit segments. The low-precision comparisons may themselves include performing further low-precision comparisons. This recursive approach allows for efficient handling of comparisons that exceed the bit capacity of individual memristors.

The recursive ACAM device is implemented with a series of interconnected comparison stages. Each comparison stage includes bit segment comparators and a pass transistor, each connected to a match line. The stages are linked by inverters, in a cascading arrangement, allowing the low-precision comparison results of a high-precision comparison to propagate through the device. This design allows the device to perform high-precision comparisons using multiple lower-precision components.

The recursive ACAM device is modular, which allows for extending the comparison precision by adding more comparison stages. Each comparison stage handles a specific bit segment of the comparison, with the comparison results cascading through the device. As precision requirements increase, this approach provides flexible precision while maintaining low hardware complexity. Furthermore, increasing comparison precision by adding more comparison stages increases the component count linearly with precision, as opposed to increasing the component count exponentially with precision. The size and power consumption of the ACAM device may thus be reduced while allowing for high comparison precision.

Figure 1:
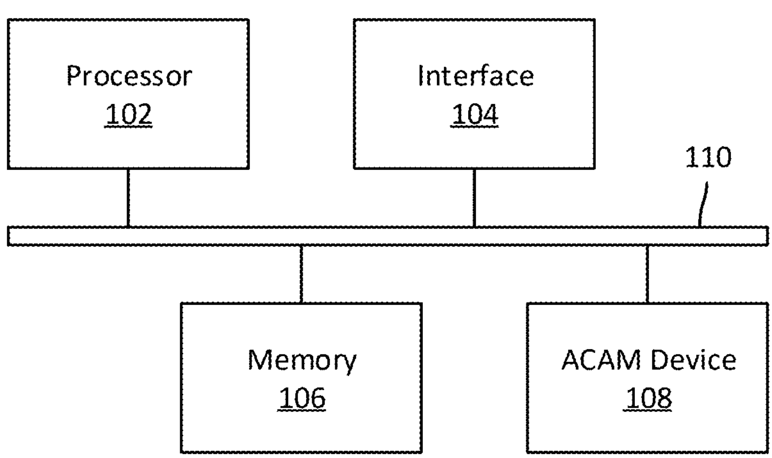
FIG. 1 is a block diagram of a computing system, according to some implementations.

FIG. 1 is a block diagram of a computing system 100, which may be used to process a machine learning model, according to some implementations. The computing system 100 may be implemented in an electronic device. Examples of electronic devices include host devices (e.g., servers, personal computers, mobile devices, etc.), network devices (e.g., routers, switches, access points, etc.), and the like.

The computing system 100 may be utilized in any data processing scenario, including stand-alone hardware, mobile applications, or combinations thereof. Further, the computing system 100 may be used in a computing network, such as a public cloud network, a private cloud network, a hybrid cloud network, other forms of networks, or combinations thereof. In one example, the methods provided by the computing system 100 are provided as a service over a network by, for example, a third party. The computing system 100 may be implemented on one or more hardware platforms, in which the modules in the system may be executed on one or more platforms. Such modules may run on various forms of cloud technologies and hybrid cloud technologies or be offered as a Software-as-a-Service that may be implemented on or off a cloud network.

To achieve its desired functionality, the computing system 100 includes various hardware components. These hardware components may include a processor 102, an interface 104, a memory 106, and an ACAM device 108. The hardware components may be interconnected through a number of busses and/or network connections. In one example, the processor 102, the interface 104, the memory 106, and the ACAM device 108 may be communicatively coupled via a bus 110, such as a PCI-Express bus.

The processor 102 retrieves executable code from the memory 106 and executes the executable code. The executable code may, when executed by the processor 102, cause the processor 102 to implement any functionality described herein. The processor 102 may be a microprocessor, an application-specific integrated circuit, a microcontroller, or the like.

The interface 104 enables the processor 102 to interact with various other hardware components, external and internal to the computing system 100. For example, the interface 104 may include interface(s) to input/output devices, such as, for example, a display device, a mouse, a keyboard, etc. Additionally or alternatively, the interface 104 may include interface(s) to storage devices, network devices, host devices, or the like.

The memory 106 may include various types of memory, including volatile and nonvolatile memory. For example, the memory 106 may include Random-Access Memory (RAM), Read-Only Memory (ROM), a Hard Disk Drive (HDD), and/or the like. Different types of memory may be used for different data storage needs. For example, the processor 102 may boot from ROM, maintain nonvolatile storage in an HDD, execute program code stored in RAM, and store data under processing in RAM. The memory 106 may include a non-transitory computer readable medium that stores instructions for execution by the processor 102. One or more modules within the computing system 100 may be partially or wholly embodied as software and/or hardware for performing any functionality described herein.

The ACAM device 108 may be an accelerator. For example, the ACAM device 108 may be used by the processor 102 to accelerate processing of a machine learning model. The ACAM device 108 is different than the processor 102. The ACAM device 108 includes ACAM cells, which may be used for computing instead of data storage by the processor 102. For example, each ACAM cell may have a structure that allows the ACAM device 108 to compute the output a predetermined function with one or more input variable(s). The ACAM device 108 may be able to process the function more efficiently than a general-purpose central processing unit (e.g., the processor 102). Accordingly, the ACAM device 108 may improve the performance of the computing system 100. Additionally or alternatively, the ACAM device 108 may be used for data storage by the processor 102.

Figure 2:
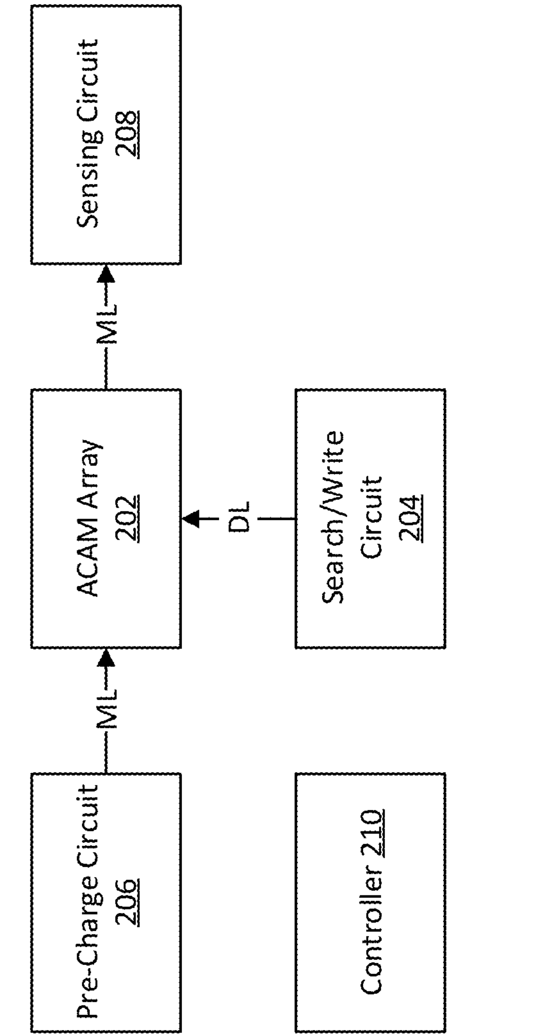
FIG. 2 is a block diagram of an ACAM device, according to some implementations.

FIG. 2 is a block diagram of the ACAM device 108, according to some implementations. The ACAM device 108 includes an ACAM array 202 as well as multiple peripheral circuits used for programming and operating the ACAM array 202. For example, the peripheral circuits may further include a search/write circuit 204, a pre-charge circuit 206, and a sensing circuit 208.

The ACAM array 202 includes multiple ACAM cells (subsequently described), which may be arranged in rows and columns. The ACAM cells search multi-level voltages and store analog ranges in their memory. One or more range(s) may be programmed for each ACAM cell of the ACAM array 202. The ACAM array 202 may be programmed with ranges that are used to compute the output of a predetermined function.

During a search operation, one or more analog input values are input to the ACAM array 202 over data lines DL. One or more ACAM cells in the ACAM array 202 indicate over match lines ML whether the analog input values are matched by their stored range(s). The stored range(s) encoded in an ACAM cell are compared against a respective analog input value. Depending on the implementation of an ACAM cell, a match may occur when an analog input value is inside of the range stored in the ACAM cell or a match may occur when an analog input value is outside of the range stored in the ACAM cell. During a write operation, one or more analog input values are communicated to one or more ACAM cells of the ACAM array 202 via the data lines DL. The stored range(s) in an ACAM cell are encoded based on a respective analog input value.

The search/write circuit 204 performs a search operation or a write operation for the ACAM array 202. The search/write circuit 204 may include a digital-to-analog converter (DAC), drivers, and the like. The DAC is used to apply write voltages to ACAM cells of the ACAM array 202 during a write operation, and to apply search voltages to ACAM cells of the ACAM array 202 during a search operation. The search/write operations may involve setting appropriate analog voltage levels to represent desired analog input values. For example, the DAC may apply write voltages to program the stored range(s) for ACAM cells of the ACAM array 202, or may apply search voltages to test whether the search voltages are matched by the range(s) programmed in ACAM cells of the ACAM array 202. Specifically, the search/write circuit 204 may apply voltages to the data lines DL of the ACAM array 202, such as via appropriate drivers.

An input value may be provided to the ACAM device 108 in the digital domain or in the analog domain. In some implementations, the search/write circuit 204 may receive a digital input value, convert the digital input value to an analog input value, and provide the analog input value to the ACAM array 202. In some implementations, the search/write circuit 204 may receive an analog input value and provide the analog input value to the ACAM array 202.

The pre-charge circuit 206 pre-charges a match line ML for one or more CAM cells of the ACAM array 202 to a target voltage before a search operation begins. During a search operation, the match line ML of the ACAM cells remains high (e.g., remains at the target voltage) to indicate a match if the analog input values applied to the ACAM cells are matched by the range(s) stored in the ACAM cells. Alternatively, the match line ML goes low (e.g., the target voltage drops) as a current in the match line ML discharges through pull-down transistors of an ACAM cell to indicate a mismatch if the analog input values applied to the ACAM cells are not matched by the range(s) stored in the ACAM cells.

The sensing circuit 208 senses the outputs of the ACAM array 202. The sensing circuit 208 may include sense amplifiers connected to some or all of the match lines ML. A sense amplifier may be used during a search operation to detect if a match line ML is high (indicating a match with one or more analog input values) or low (indicating a mismatch with the analog input values).

The ACAM device 108 may also include a controller 210 for controlling the components of the ACAM device 108. For example, the controller 210 may control the sensing circuit 208, the pre-charge circuit 206, and the search/write circuit 204. The controller 210 may include a digital control circuit such as a microcontroller, an application-specific integrated circuit, or the like. The digital control circuit provides necessary control signals and data to the sensing circuit 208 and the search/write circuit 204. For example, the digital control circuit may be used to drive a DAC of the search/write circuit 204, as well as control and coordinate the operation of the DAC. The controller 210 may include other components, such a clock circuit for temporalizing operations in the ACAM device 108.

The ACAM device 108 may be implemented as an integrated circuit (IC) on a semiconductor substrate using suitable microfabrication techniques. Such an IC may integrate the ACAM array 202, the search/write circuit 204, the pre-charge circuit 206, the sensing circuit 208, and any other components onto a single chip. The resulting IC may be packaged and integrated into a larger system, as desired.

Determining whether a value falls within a stored range includes performing comparison operations. For example, determining whether a value x falls within the range defined by [a, b) includes evaluating x≥a and x<b. The ACAM device 108 may be used for high precision comparisons, which may allow a, b, and x to be high-precision numbers, such as numbers with a precision of 8 bits, 12 bits, 16 bits, or more.

A high-precision comparison equation can be recursively expanded. This recursive expansion allows for comparisons of arbitrary precision using lower-precision comparison equations. For example, a comparison x≥a may be broken down into comparisons of most significant bits (MSB) and least significant bits (LSB), as shown in Equation (1).

$$x \geq a = (x_{MSB} \geq a_{MSB}) \wedge [(x_{MSB} \geq a_{MSB} + 1) \vee (x_{LSB} \geq a_{LSB})] \quad (1)$$

In Equation (1), $x_{MSB}$ and $a_{MSB}$ represent the most significant bits of x and a, respectively, while $x_{LSB}$ and $a_{LSB}$ represent the least significant bits (other than the most significant bits). Equation (1) can be further expanded recursively for $x_{LSB} \geq a_{LSB}$, as needed. For example, $x_{LSB}$ and $a_{LSB}$ may again be divided into parts of most and least significant bits, and those parts evaluated using Equation (1). This recursive expansion allow for the implementation of high-precision comparisons using lower-precision components. In Equation (1), $a_{MSB+}1$ is offset from $a_{MSB}$ by one. As subsequently described in greater detail, ACAM cells may store $a_{MSB}$ and $a_{MSB+}1$ for evaluation against $x_{MSB}$.

In a similar manner, a comparison x<b may also be broken down into comparisons of most significant bits (MSB) and least significant bits (LSB), as shown in Equation (2).

$$x < b = (x_{MSB} < b_{MSB} + 1) \wedge [(x_{MSB} < b_{MSB}) \vee (x_{LSB} < b_{LSB})] \quad (2)$$

In Equation (2), $x_{MSB}$ and $b_{MSB}$ represent the most significant bits of x and b, respectively, while $x_{LSB}$ and $b_{LSB}$ represent the least significant bits (other than the most significant bits). Equation (2) can be further expanded recursively for $x_{LSB} < b_{LSB}$, as needed. For example, $x_{LSB}$ and $b_{LSB}$ may again be divided into parts of most and least significant bits, and those parts evaluated using Equation (2). In Equation (2), $b_{MSB+}1$ is offset from $b_{MSB}$ by one. As subsequently described in greater detail, ACAM cells may store $b_{MSB}$ and $b_{MSB+}1$ for evaluation against $x_{MSB}$.

Figure 3:
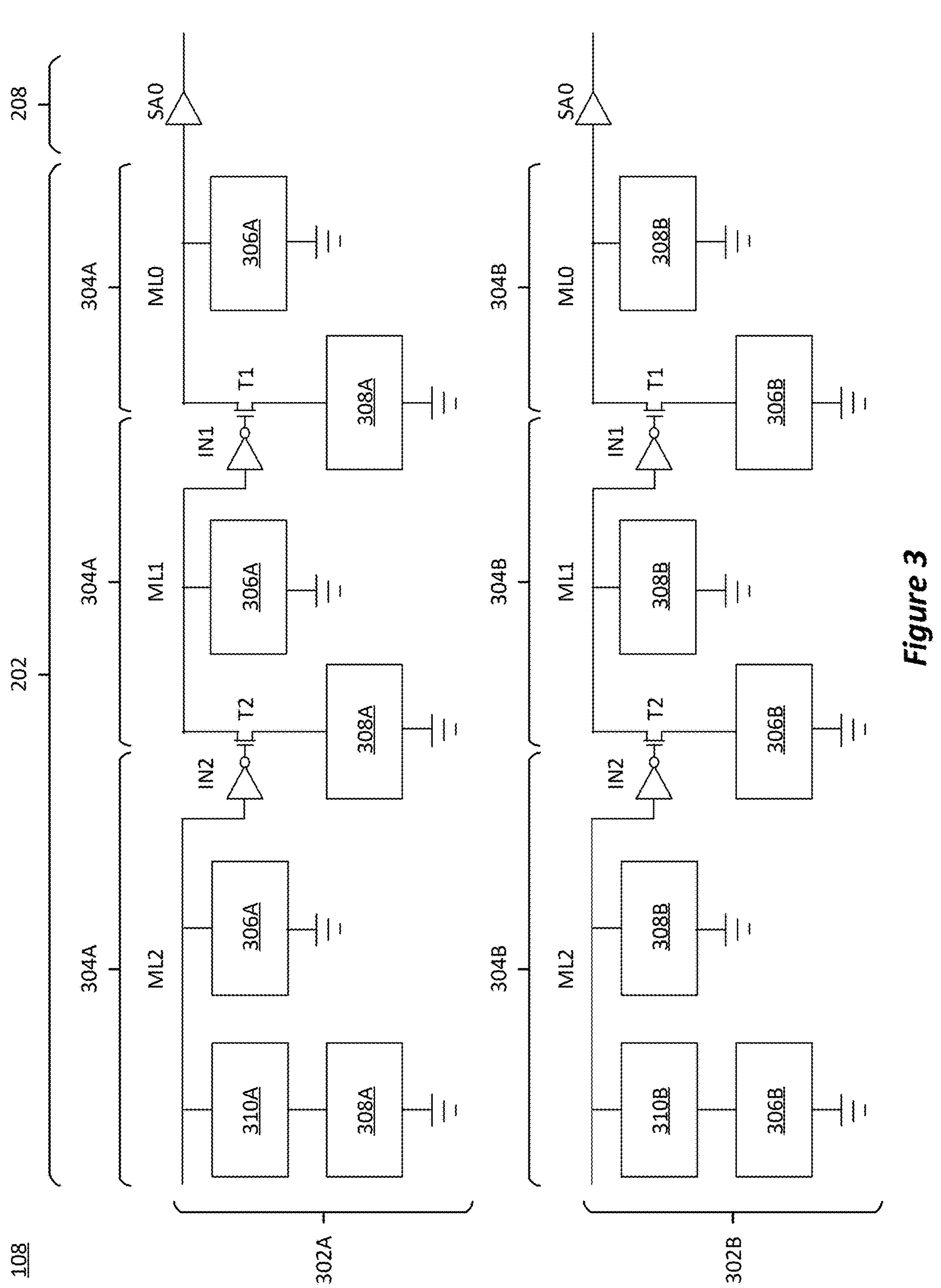
FIG. 3 shows a circuit configuration for an ACAM device, according to some implementations.

FIG. 3 shows a circuit configuration for the ACAM device 108, according to some implementations. Some components of the ACAM device 108 of FIG. 2, including a portion of the ACAM array 202 and a portion of the sensing circuit 208, are shown. Specifically, FIG. 3 illustrates components of a recursive ACAM device, which may be used to store a high-precision range and determine whether a high-precision input value falls in the high-precision range. The range and input value may each have higher precision than the individual ACAM cells of the ACAM array 202.

The recursive ACAM device includes a lower bound comparison circuit 302A and an upper bound comparison circuit 302B. These circuits work in parallel to determine if an input value falls within a range stored within the recursive ACAM device. That is, the recursive ACAM device is configured to determine if the input value is greater than or equal to a lower bound stored within the lower bound comparison circuit 302A and is less than an upper bound stored within the upper bound comparison circuit 302B. The outputs of the lower and upper bound comparison circuits may be combined using a combining circuit (described later) to obtain the final comparison result, indicating whether the input value falls within the stored high-precision range.

The lower bound comparison circuit 302A and the upper bound comparison circuit 302B each comprise recursive comparators. Specifically, the lower bound comparison circuit 302A includes multiple lower bound comparison stages 304A connected in series, while the upper bound comparison circuit 302B includes multiple upper bound comparison stages 304B connected in series. Each stage of a comparison circuit includes components connected to a match line for performing segment-wise comparisons of an input value with the bits of the range stored in that stage. This arrangement allows for efficient handling of high-precision comparisons using lower-precision components in a recursive manner.

Each lower bound comparison stage 304A includes a match line ML (including match lines ML2, ML1, ML0 in this example). The match lines ML of adjacent ones of the lower bound comparison stages 304A are serially connected. The lower bound comparison circuit 302A may store the lower bound of the stored range, and compare its input against that lower bound. Each lower bound comparison stage 304A may be configured to perform a comparison for a specific segment of bits from a partitioned input value, specifically, comparing against a specific segment of bits from the lower bound of the stored range. For example, in a system with a 12-bit input value, three lower bound comparison stages 304A may be utilized, with each lower bound comparison stage 304A handling a 4-bit segment of the input value. The least significant bits may be compared in the initial lower bound comparison stage 304A, with more significant bits being compared in subsequent lower bound comparison stages 304A. This segmented approach may allow for efficient comparison of high-precision values using lower-precision components.

Each lower bound comparison stage 304A includes a base segment comparator 306A and an incremented segment comparator 308A. The base segment comparator 306A may be configured to determine whether an input segment is greater than or equal to a stored base threshold. In some aspects, an input segment may refer to a specific portion or subset of bits from the input value that is being compared. For example, if the input value is a 12-bit number, the input segment may be a 4-bit portion of that number. The input segment may represent a particular range of significance within the overall input value, such as the most significant bits, middle bits, or least significant bits. The incremented segment comparator 308A may be configured to determine whether the same input segment is greater than or equal to a stored incremented threshold. The base threshold and incremented threshold may be related values that define part of the range for comparison. Specifically, the base threshold may be a reference value, and the incremented threshold may be an offset from that reference value (by one). This allows each comparison stage to evaluate whether an input segment is greater than or is equal to the stored base threshold.

Each lower bound comparison stage 304A except the final stage 304A further includes an inverter IN (including inverters IN2, IN1 in this example) connected to the stage's match line ML. The inverters IN are used to propagate comparison results between stages 304A in a cascading manner. The output of each inverter IN is connected to the subsequent stage 304A. This arrangement allows the comparison results from one stage to influence the operation of the next stage.

Each lower bound comparison stage 304A except the initial stage 304A further includes a pass transistor (including pass transistors T2, T1 in this example). The pass transistor T of a stage 304A may be controlled by the previous stage 304A to effectively provide the result of the comparison of the less significant bits of the input. Specifically, the gate of each pass transistor T is connected to the output of an inverter IN from the previous stage 304A. This arrangement allows the comparison results to propagate through the stages in a cascading manner. When a previous stage 304A indicates a match (e.g., the respective segment of the input segment is greater than or equal to the stored threshold), the inverter IN output goes low, turning off the pass transistor T in the current stage 304A. This effectively disables the incremented segment comparator 308A in the current stage 304A, as its match line ML can no longer be pulled low through that path. Conversely, if the previous stage 304A indicates a mismatch, the pass transistor remains on, allowing the incremented segment comparator 308A to participate in the current stage's 304A comparison. This cascading control mechanism enables the device to perform high-precision comparisons using multiple lower-precision components, with each stage building upon the results of the previous stages.

The initial lower bound comparison stage 304A further includes a least significant segment comparator 310A. The least significant segment comparator 310A may be configured to perform a comparison for the least significant bits of the input. Specifically, the least significant segment comparator 310A may be configured to determine whether an input segment is greater than or equal to a stored threshold for the least significant bits. Thus, the initial lower bound comparison stage 304A may store and compare two segments of the lower bound threshold. Specifically, the base segment comparator 306A and incremented segment comparator 308A may store and compare one segment, while the least significant segment comparator 310A may store and compare an additional segment containing the least significant bits of the input. In contrast, other lower bound comparison stages 304A may each only store and compare a single segment using their base segment comparator 306A and incremented segment comparator 308A.

The base segment comparators 306A, incremented segment comparators 308A, and least significant segment comparator 310A may be implemented using any circuit that can store a value and determine whether an input value is greater than or equal to the stored value. In some implementations, the comparators may be implemented using analog content addressable memory (ACAM) cells. An example ACAM cell which may be utilized for these comparators will be subsequently described for FIG. 4A. The ACAM cells of the lower bound comparison circuit 302A (forming the base segment comparators 306A, incremented segment comparators 308A, and/or least significant segment comparator 310A) may have equal or unequal resolution. In some implementations, all ACAM cells may be configured to store the same number of bits, providing uniform precision across the comparison stages. In some implementations, the resolution of the ACAM cells may vary between stages or within a stage. For example, ACAM cells handling more significant bits may have higher resolution than those handling less significant bits.

In each lower bound comparison stage 304A, the base segment comparator 306A may be connected directly between the stage's match line ML and a reference node (e.g., ground). This allows the base segment comparator 306A to potentially pull the match line ML low when a mismatch is detected. Furthermore, the incremented segment comparator 308A may be connected between the match line ML and the reference node. The incremented segment comparator 308A may be connected in series with the least significant segment comparator 310A (in the initial stage) or pass transistor T (in subsequent stages). This connection allows for more complex control of the match line ML. The pass transistor T may act as a switch, controlled by the previous stage, to enable or disable the incremented segment comparator 308A. When enabled, the incremented segment comparator 308A may pull the match line ML low through the pass transistor T if a mismatch is detected with the input. In the initial stage, the least significant segment comparator 310A may be added to this series connection (in lieu of a pass transistor), allowing for comparison of additional bits.

The sensing circuit 208 may include a sense amplifier SAO connected to the match line ML0 of the final stage 304A in the lower bound comparison circuit 302A. This sense amplifier SAO may be configured to detect the voltage level on the match line ML0 when a comparison operation is performed. In some aspects, the sense amplifier SAO may amplify small voltage differences on the match line ML0, allowing for more accurate detection of match or mismatch conditions. The output of the sense amplifier SAO may provide a digital signal indicating whether the input value is greater than or equal to the lower bound of the stored range.

In operation, a high-precision input value to the lower bound comparison circuit 302A may be partitioned into multiple segments. These segments may then be compared against the thresholds stored in the lower bound comparison stages 304A of the lower bound comparison circuit 302A. For example, the base segment comparators 306A, incremented segment comparators 308A, and least significant segment comparators 310A may compare segments of the input value against stored thresholds correspond to segments of the lower bound of the range. The results of these comparisons may propagate through the lower bound comparison stages 304A, with the inverters IN and pass transistors T controlling the flow of comparison results between stages. The final result, indicating whether the input value is greater than or equal to the lower bound of the stored range, may be detected by the sense amplifier SAO connected to the match line ML0 of the final stage 304A. This segmented approach may allow the lower bound comparison circuit 302A to perform high-precision comparisons using multiple lower-precision components in an efficient manner.

Each upper bound comparison stage 304B includes a match line ML (including match lines ML2, ML1, ML0 in this example). The match lines ML of adjacent ones of the upper bound comparison stages 304B are serially connected. The upper bound comparison circuit 302B may store the upper bound of the stored range, and compare its input against that upper bound. Each upper bound comparison stage 304B may be configured to perform a comparison for a specific segment of bits from a partitioned input value, specifically, comparing against a specific segment of bits from the upper bound of the stored range. For example, in a system with a 12-bit input value, three upper bound comparison stages 304B may be utilized, with each upper bound comparison stage 304B handling a 4-bit segment of the input value. The least significant bits may be compared in the initial upper bound comparison stage 304B, with more significant bits being compared in subsequent upper bound comparison stages 304B. This segmented approach may allow for efficient comparison of high-precision values using lower-precision components.

Each upper bound comparison stage 304B includes a base segment comparator 306B and an incremented segment comparator 308B. The base segment comparator 306B may be configured to determine whether an input segment is less than a stored base threshold. The incremented segment comparator 308B may be configured to determine whether the same input segment is less than a stored incremented threshold. The base threshold and incremented threshold may be related values that define part of the range for comparison. Specifically, the base threshold may be a reference value, and the incremented threshold may be an offset from that reference value (by one). This allows each comparison stage to evaluate whether an input segment is less than or equal to the stored base threshold.

Each upper bound comparison stage 304B except the final stage 304B further includes an inverter IN (including inverters IN2, IN1 in this example) connected to the stage's match line ML. The inverters IN are used to propagate comparison results between stages 304B in a cascading manner. The output of each inverter IN is connected to the subsequent stage 304B. This arrangement allows the comparison results from one stage to influence the operation of the next stage.

Each upper bound comparison stage 304B except the initial stage 304B further includes a pass transistor (including pass transistors T2, T1 in this example). The pass transistor T of a stage 304B may be controlled by the previous stage 304B to effectively provide the result of the comparison of the less significant bits of the input. Specifically, the gate of each pass transistor T is connected to the output of an inverter IN from the previous stage 304B. This arrangement allows the comparison results to propagate through the stages in a cascading manner. When a previous stage 304B indicates a match (e.g., the respective segment of the input segment is less than the stored threshold), the inverter IN output goes low, turning off the pass transistor T in the current stage 304B. This effectively disables the base segment comparator 306B in the current stage 304B, as its match line ML can no longer be pulled low through that path. Conversely, if the previous stage 304B indicates a mismatch, the pass transistor remains on, allowing the base segment comparator 306B to participate in the current stage's 304B comparison. This cascading control mechanism enables the device to perform high-precision comparisons using multiple lower-precision components, with each stage building upon the results of the previous stages.

The initial upper bound comparison stage 304B further includes a least significant segment comparator 310B. The least significant segment comparator 310B may be configured to perform a comparison for the least significant bits of the input. Specifically, the least significant segment comparator 310B may be configured to determine whether an input segment is less than a stored threshold for the least significant bits. Thus, the initial upper bound comparison stage 304B may store and compare two segments of the upper bound threshold. Specifically, the base segment comparator 306B and incremented segment comparator 308B may store and compare one segment, while the least significant segment comparator 310B may store and compare an additional segment containing the least significant bits of the input. In contrast, other upper bound comparison stages 304B may each only store and compare a single segment using their base segment comparator 306B and incremented segment comparator 308B.

The base segment comparators 306B, incremented segment comparators 308B, and least significant segment comparator 310B may be implemented using any circuit that can store a value and determine whether an input value is less than the stored value. In some implementations, the comparators may be implemented using analog content addressable memory (ACAM) cells. An example ACAM cell which may be utilized for these comparators will be subsequently described for FIG. 4B. The ACAM cells of the upper bound comparison circuit 302B (forming the base segment comparators 306B, incremented segment comparators 308B, and/or least significant segment comparator 310B) may have equal or unequal resolution.

In each upper bound comparison stage 304B, the incremented segment comparator 308B may be connected directly between the stage's match line ML and a reference node (e.g., ground). This allows the incremented segment comparator 308B to potentially pull the match line ML low when a mismatch is detected. Furthermore, the base segment comparator 306B may be connected between the match line ML and the reference node. The base segment comparator 306B may be connected in series with the least significant segment comparator 310B (in the initial stage) or pass transistor T (in subsequent stages). This connection allows for more complex control of the match line ML. The pass transistor T may act as a switch, controlled by the previous stage, to enable or disable the base segment comparator 306B. When enabled, the base segment comparator 306B may pull the match line ML low through the pass transistor T if a mismatch is detected with the input. In the initial stage, the least significant segment comparator 310B may be added to this series connection (in lieu of a pass transistor), allowing for comparison of additional bits.

The sensing circuit 208 may include a sense amplifier SAO connected to the match line ML0 of the final stage 304B in the upper bound comparison circuit 302B. This sense amplifier SAO may be configured to detect the voltage level on the match line ML0 when a comparison operation is performed. In some aspects, the sense amplifier SAO may amplify small voltage differences on the match line ML0, allowing for more accurate detection of match or mismatch conditions. The output of the sense amplifier SAO may provide a digital signal indicating whether the input value is less than the lower bound of the stored range.

In operation, a high-precision input value to the upper bound comparison circuit 302B may be partitioned into multiple segments. These segments may then be compared against the thresholds stored in the upper bound comparison stages 304B of the upper bound comparison circuit 302B. For example, the base segment comparators 306B, incremented segment comparators 308B, and least significant segment comparators 310B may compare segments of the input value against stored thresholds correspond to segments of the upper bound of the range. The results of these comparisons may propagate through the upper bound comparison stages 304B, with the inverters IN and pass transistors T controlling the flow of comparison results between stages. The final result, indicating whether the input value is less than the upper bound of the stored range, may be detected by the sense amplifier SAO connected to the match line ML0 of the final stage 304B. This segmented approach may allow the upper bound comparison circuit 302B to perform high-precision comparisons using multiple lower-precision components in an efficient manner.

Figure 4B:
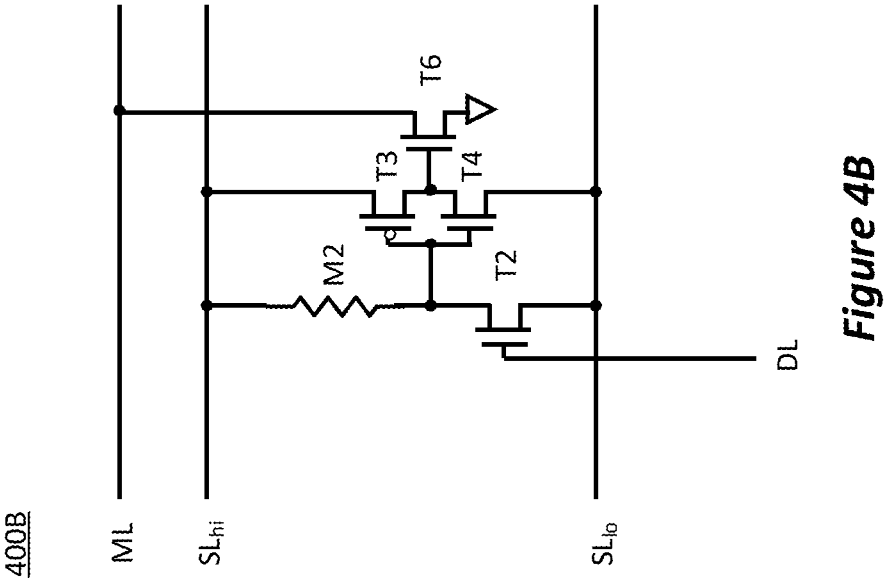
FIGS. 4A-4B illustrate circuit configurations for ACAM cells, according to some implementations.
Figure 4A:
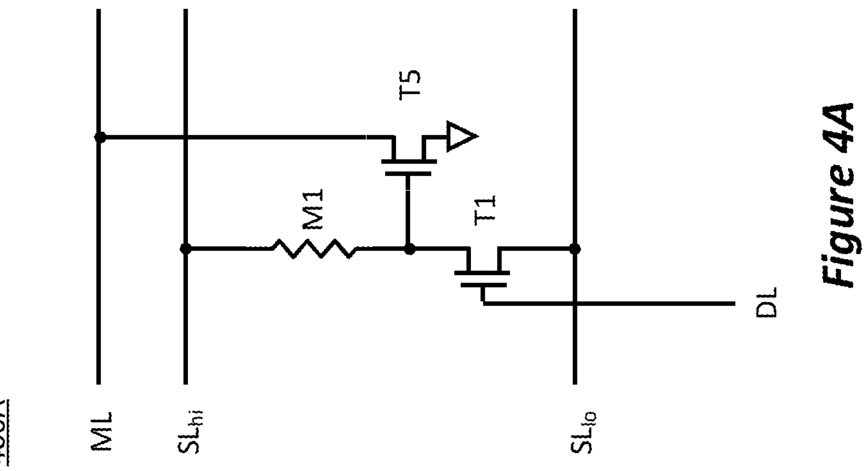

FIGS. 4A-4B illustrate circuit configurations for ACAM cells, according to some implementations. The illustrated circuit configurations may be used to implement various comparators in the recursive ACAM device of FIG. 3. FIG. 4A shows a circuit configuration of an ACAM cell 400A, which may correspond to an implementation of a comparator in a lower bound comparison stage. The ACAM cell 400A may include components for checking if an input value is greater than or equal to a stored threshold. FIG. 4B shows a circuit configuration of an ACAM cell 400B, which may correspond to an implementation of a comparator in an upper bound comparison stage. The ACAM cell 400B may include components for checking if an input value is less than a stored threshold.

The ACAM cells 400A, 400B each include a memristor and a plurality of transistors. A memristor is a non-volatile electronic memory device, whose resistance can be programmed. Thus, an analog value can be stored in (or encoded on) an ACAM cell by programming the conductance of its memristor. The conductance of a memristor may be programmed by imposing a voltage (corresponding to the desired conductance) across the memristor. The transistors may be implemented as metal-oxide-semiconductor field-effect transistors (MOSFETs), or the like.

Referring to FIG. 4A, the ACAM cell 400A includes a pull-down transistor T5 and a memory circuit. The memory circuit includes a memristor-transistor pair M1/T1. Thus, the ACAM cell 400A includes two transistors and one memristor. The output of the memory circuit is connected to the gate of the pull-down transistor T5. The pull-down transistor T5 is connected between a match line ML and a reference node. The memory circuit may be configured to store a threshold and to activate the pull-down transistor T5 when an analog input value is greater than or equal to the stored threshold.

The memristor-transistor pair M1/T1 is connected between a high source line $SL_{hi}$ and a low source line $SL_{lo}$. These source lines may be used to program the memristor M1 by applying appropriate voltages. The gate of the transistor T1 is connected to a data line DL, which may be used to provide the analog input value for comparison.

During a write operation, programming voltages may be applied to the memristor M1 to program the threshold. This may be done by applying a voltage to the high source line $SL_{hi}$ to increase the conductance of the memristor M1, or applying a voltage to the low source line $SL_{lo}$ to decrease the conductance of the memristor M1. A voltage may also be applied to the data line DL during the write operation.

During a search operation, a voltage is applied to the data line DL to provide the analog input value for comparison with the threshold stored in the memory circuit. The data line DL is electrically connected to the gate of the transistor T1. Therefore, the ACAM cell 400A receives the analog input value via the data line DL. The analog input value provided on the data line DL may be a segment of a high-precision input value.

Whether a match is found between the analog input value and the stored threshold is indicated over the match line ML. The match line ML may be pre-charged to a voltage before a search operation begins. As the search operation is performed, the match line ML may remain high (outputting a match signal) to indicate a match if the analog input value is greater than or equal to the stored threshold. Alternatively, the match line ML may go low to indicate a mismatch if the analog input value is less than the stored threshold.

Referring to FIG. 4B, the ACAM cell 400B includes a pull-down transistor T6 and a memory circuit. The memory circuit includes a memristor-transistor pair M2/T2 and an inverter formed by transistors T3-T4. Thus, the ACAM cell 400B includes four transistors and one memristor. The output of the memory circuit is connected to the gate of the pull-down transistor T6. Specifically, the output of the memristor-transistor pair M2/T2 is inverted via the inverter, and the output of that inverter is connected to the pull-down transistor T6. The pull-down transistor T6 is connected between a match line ML and a reference node. The memory circuit may be configured to store a threshold and to activate the pull-down transistor T6 when an analog input value is less than the stored threshold.

The memristor-transistor pair M2/T2 is connected between a high source line $SL_{hi}$ and a low source line $SL_{lo}$. These source lines may be used to program the memristor M2 by applying appropriate voltages. The gate of the transistor T2 is connected to a data line DL, which may be used to provide the analog input value for comparison.

During a write operation, programming voltages may be applied to the memristor M2 to program the threshold. This may be done by applying a voltage to the high source line $SL_{hi}$ to increase the conductance of the memristor M2, or applying a voltage to the low source line $SL_{lo}$ to decrease the conductance of the memristor M2. A voltage may also be applied to the data line DL during the write operation.

During a search operation, a voltage is applied to the data line DL to provide the analog input value for comparison with the threshold stored in the memory circuit. The data line DL is electrically connected to the gate of the transistor T2. Therefore, the ACAM cell 400B receives the analog input value via the data line DL. The analog input value provided on the data line DL may be a segment of a high-precision input value.

Whether a match is found between the analog input value and the stored threshold is indicated over the match line ML. The match line ML may be pre-charged to a voltage before a search operation begins. As the search operation is performed, the match line ML may remain high (outputting a match signal) to indicate a match if the analog input value is less than the stored threshold. Alternatively, the match line ML may go low to indicate a mismatch if the analog input value is greater than or equal to the stored threshold.

The ACAM cells 400A, 400B cells may be configured to store various numbers of bits, allowing for flexible precision in comparisons. In some implementations, the ACAM cells may be designed to store a number of bits in a range of three to four bits. This configuration provides a balance between precision and hardware complexity. In some implementations, the ACAM cells may each be configured to store a same predetermined number of bits. In some implementations, different ACAM cells within the device may be configured to store different numbers of bits, allowing for optimized resource allocation based on the significance of different parts of the comparison. For example, a first subset of the ACAM cells may be configured to store a first number of bits, while a second subset of the ACAM cells may be configured to store a second number of bits.

The number of bits stored in each ACAM cell may be determined dynamically during operation. In some implementations, a calibration or startup sequence may be performed (e.g., by the controller 210, see FIG. 2) to determine the maximum number of bits that can be reliably stored and compared in each ACAM cell. This allows the system to adapt to variations in the analog characteristics of the memristors and optimize for reliability and precision. Furthermore, the quantization level of the ACAM cells may be utilized as a parameter, allowing the system to balance precision, reliability, and resource utilization based on the requirements of the specific application.

Figures 5A, 5B:
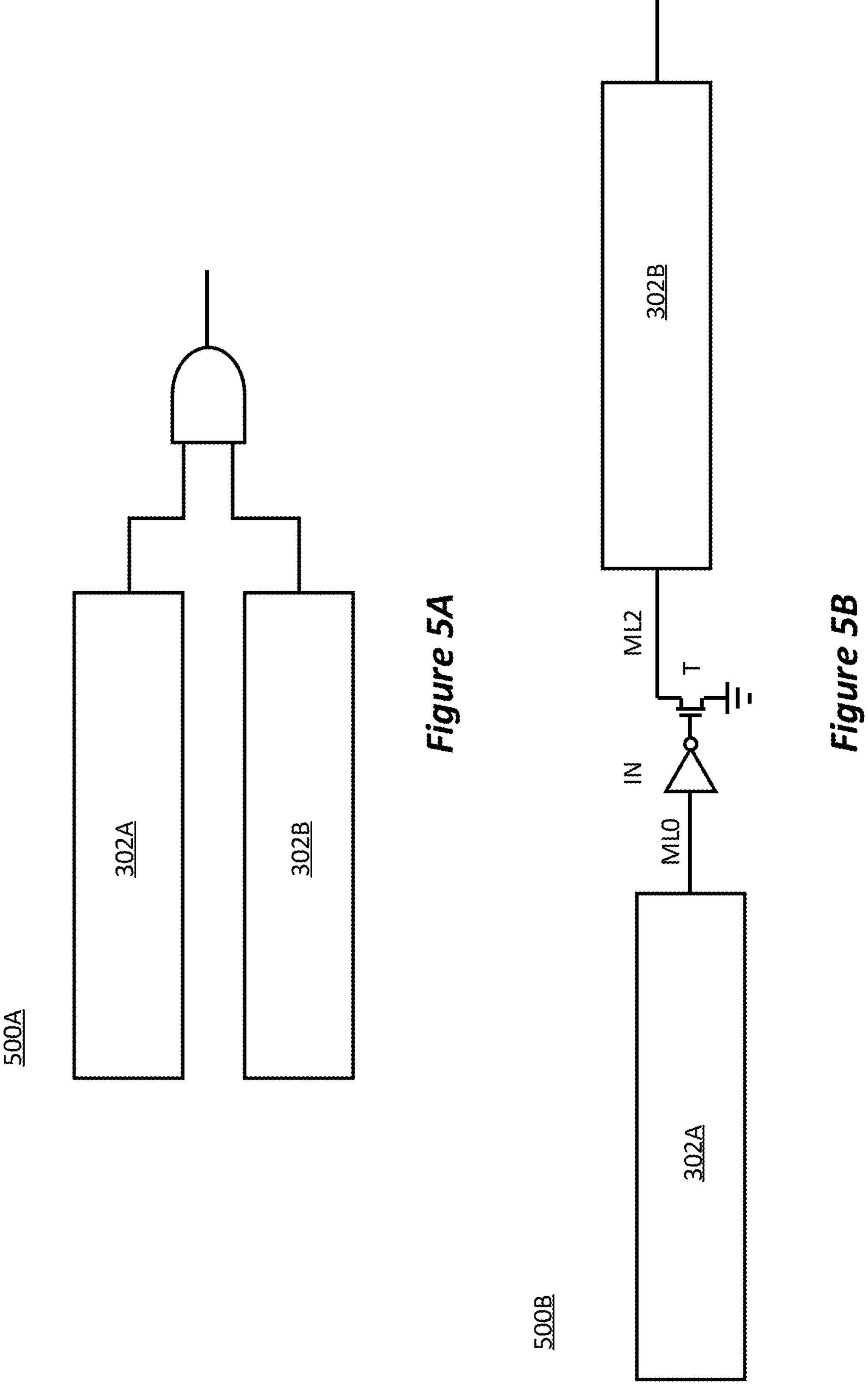
FIGS. 5A-5B illustrate circuit configurations for combining circuits, according to some implementations.

FIGS. 5A-5B illustrate circuit configurations for combining circuits, according to some implementations. The illustrated circuit configurations may be used to combine the outputs of the lower and upper bound comparison circuits of FIG. 3. FIG. 5A shows a circuit configuration of a combining circuit 500A, which is configured to combine the outputs of the lower bound comparison circuit 302A and the upper bound comparison circuit 302B in the digital domain. FIG. 5B shows a circuit configuration of a combining circuit 500B, which is configured to combine the outputs of the lower bound comparison circuit 302A and the upper bound comparison circuit 302B in the analog domain.

Referring to FIG. 5A, the combining circuit 500A includes an AND gate connected to the output sense amplifiers of the lower bound comparison circuit 302A and the upper bound comparison circuit 302B. The AND gate may receive the outputs from the sense amplifiers as inputs. In some aspects, the AND gate performs a logical AND operation on these inputs to produce a single output. This output indicates whether an input value to the bound comparison circuits falls within the range defined by the lower and upper bounds. For example, if both sense amplifiers of the bound comparison circuits output a high signal (indicating the input is greater than or equal to the lower bound and also less than the upper bound), the AND gate may output a high signal, signifying the input is within the specified range. Conversely, if either sense amplifier outputs a low signal, the AND gate may output a low signal, indicating the input is outside the range. This configuration allows the combining circuit 500A to combine the results from the lower and upper bound comparisons into a single result in the digital domain.

Referring to FIG. 5B, the combining circuit 500B includes an inverter IN connected to the output of the lower bound comparison circuit 302A and a transistor T connected to the output of the upper bound comparison circuit 302B. The inverter IN may invert the output signal from the lower bound comparison circuit 302A. The inverted signal is then applied to the gate of the transistor T. The transistor T may act as a switch, controlled by the inverted output of the lower bound comparison circuit 302A. In some implementations, the output sense amplifier may be omitted from the lower bound comparison circuit 302A in this configuration, as the inverter IN may directly receive the signal from the match line of the final comparison stage in the lower bound comparison circuit 302A. The drain of the transistor T may be connected to the input of the upper bound comparison circuit 302B, while its source may be connected to a reference node (e.g., ground). During operation, if the lower bound comparison indicates a match (e.g., the input is greater than or equal to the lower bound), the inverter IN may output a low signal, turning off the transistor T and allowing the output of the upper bound comparison circuit 302B to propagate. Conversely, if the lower bound comparison indicates a mismatch, the transistor T may be turned on, potentially pulling the output low regardless of the upper bound comparison result. This configuration allows the combining circuit 500B to combine the results from the lower and upper bound comparisons into a single result in the analog domain.

Figure 6:
FIG. 6 is a flow diagram of a high-precision comparison method, according to some implementations.
Figure 6:
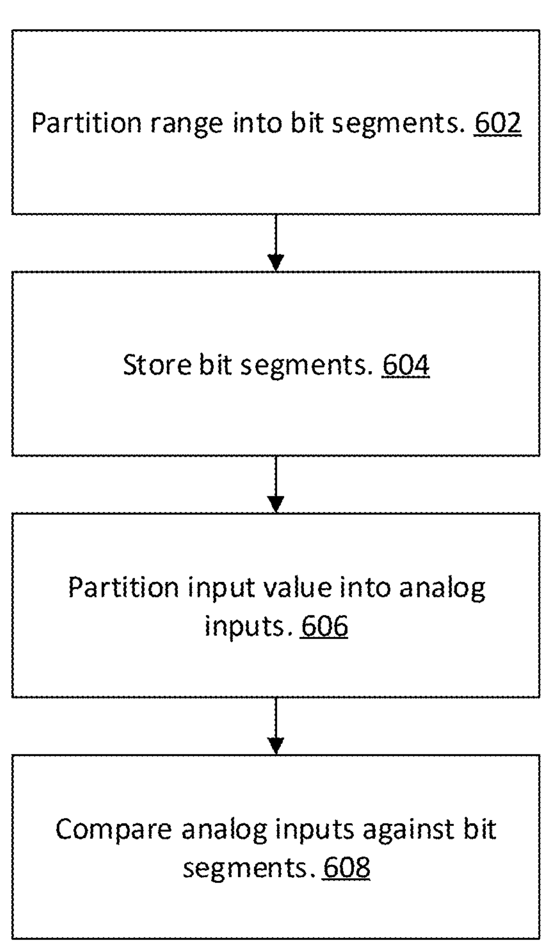

FIG. 6 is a flow diagram of a high-precision comparison method 600, according to some implementations. The high-precision comparison method 600 will be described in conjunction with the recursive ACAM device of FIGS. 3-5B. The high-precision comparison method 600 may be implemented by the ACAM device 108. Specifically, the controller 210 may perform the high-precision comparison method 600.

The ACAM device 108 may perform a step 602 of partitioning a range into a plurality of bit segments, where the range has a higher precision than the bit segments. For example, if the range has 12 bits of precision, it may be partitioned into three bit segments of 4 bits each. In some implementations, the bit segments may have equal bit length. In some implementations, the bit segments may have unequal bit length. The choice of bit segment length may depend on the specific requirements of the comparison being performed. The range may include a lower bound and an upper bound.

The ACAM device 108 may perform a step 604 of storing the bit segments in comparison stages of a comparison circuit. Each of the comparison stages may include a match line and an analog content addressable memory connected between the match line and a reference node. The match lines of adjacent comparison stages may be serially connected.

The ACAM device 108 may perform a step 606 of partitioning an input value into a plurality of analog inputs. The analog inputs may have lower resolution than the input value. For example, if the input value has 12 bits of precision, it may be partitioned into three analog inputs each having 4 bits of precision.

The ACAM device 108 may perform a step 608 of comparing the analog inputs against the bit segments to determine whether the input value falls in the range. This comparison may involve evaluating each partitioned analog input against its corresponding stored bit segment within the comparison stages. The comparison stages may include first comparison stages for the lower bound of the range and second comparison stages for the upper bound of the range.

The ACAM device 108 may optionally perform a step of combining results from the first comparison stages and the second comparison stages. In some implementations, this combining may be performed in the digital domain using a logical AND operation. In other implementations, this combining may be performed in the analog domain using an inverter and a pass transistor.

The recursive ACAM device may offer efficient resource utilization as the precision of comparisons increases. In some aspects, the component count of the device may increase linearly with precision, rather than exponentially. This linear scaling may be achieved by adding a fixed number of components for each additional bit segment of precision. For example, when the bit segments are 4 bits long, increasing the precision by 4 bits may only require adding one inverter, one transistor, and two comparison blocks to each of the lower and upper bound comparison circuits. This approach may allow for flexible precision while maintaining relatively low hardware complexity. Furthermore, this approach allows energy dissipation of the ACAM device to also scale linearly rather than exponentially.

The high-precision comparison capabilities described previously may be particularly useful for general computing applications. By leveraging the ability to compare input values against stored ranges with high precision, the ACAM device can efficiently implement various mathematical functions and algorithms. In some aspects, the ACAM device may be programmed to store predetermined functions as mappings between input ranges and output binary codes. For example, decimal inputs to a predetermined function may be encoded as analog voltage levels and compared against stored threshold ranges in the ACAM cells (corresponding to the predetermined function). The ACAM device may directly output the corresponding binary-coded function result. This enables rapid evaluation of complex mathematical operations like sigmoids, exponentials, logarithms, or trigonometric functions using a single analog comparison operation. The precision of the computed result may be increased by using additional ACAMs to represent more output bits.

Figure 7:
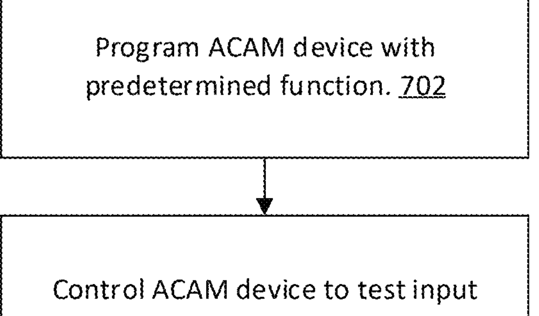
FIG. 7 is a flow diagram of an ACAM computing method, according to some implementations.

FIG. 7 is a flow diagram of an ACAM computing method 700, according to some implementations. The ACAM computing method 700 may be implemented by the computing system 100 of FIG. 1. Specifically, the processor 102 may perform the ACAM computing method 700 when using the ACAM device 108 for general computing. The computing system 100 may perform a step 702 of programming an ACAM device 108 with a predetermined function. The ACAM array 202 of the ACAM device 108 may be programmed in a similar manner as previously described for FIG. 6. The computing system 100 may perform a step 704 of controlling the ACAM device 108 to test an input value. The input value represents a decimal input to the predetermined function. In some implementations, the input value is provided to the search/write circuit 204 of the ACAM device 108. The output of the ACAM device 108 may be directly read (such as by the processor 102) to obtain the result of computing the output of the predetermined function for the decimal input.

Some variations are contemplated. In some implementations, the recursive ACAM device may be programmed to operate as a standard Content Addressable Memory (CAM), providing additional flexibility in its application. This alternative functionality can be achieved by programming each base segment comparator 306B in the upper bound comparison circuit 302B to an "always mismatch" state. An "always mismatch" state may be implemented with a base segment comparator 306B by setting the stored threshold in the base segment comparator 306B to a value outside the valid input range, or by utilizing a programmable flag that forces a mismatch output regardless of the input. When the base segment comparators 306B are programmed in this manner, the comparison result for each stage 304B depends solely on the incremented segment comparators 308B, effectively transforming them into equality comparators similar to those in a standard CAM. The lower bound comparison circuit 302A may be similarly configured, by programming each incremented segment comparator 308A in the upper bound comparison circuit 302B to an "always mismatch" state, so that the comparison result for each stage 304A depends solely on the base segment comparators 306A. This configuration allows the ACAM device 108 to perform multiple low-precision comparisons, rather than performing high-precision range comparisons using the recursive formulation outlined by Equations (1) and (2).

Although this disclosure describes or illustrates particular operations as occurring in a particular order, this disclosure contemplates the operations occurring in any suitable order. Moreover, this disclosure contemplates any suitable operations being repeated one or more times in any suitable order. Although this disclosure describes or illustrates particular operations as occurring in sequence, this disclosure contemplates any suitable operations occurring at substantially the same time, where appropriate. Any suitable operation or sequence of operations described or illustrated herein may be interrupted, suspended, or otherwise controlled by another process, such as an operating system or kernel, where appropriate. The acts can operate in an operating system environment or as stand-alone routines occupying all or a substantial part of the system processing.

While this disclosure has been described with reference to illustrative implementations, this description is not intended to be construed in a limiting sense. Various modifications and combinations of the illustrative implementations, as well as other implementations of the disclosure, will be apparent to persons skilled in the art upon reference to the description. It is therefore intended that the appended claims encompass any such modifications or implementations.

What is claimed is:

1. A device comprising:
- a first comparison stage comprising:
  - a first match line;
  - a first base segment comparator connected between the first match line and a reference node;
  - a first incremented segment comparator; and
  - a first pass transistor, the first pass transistor and the first incremented segment comparator being connected in series between the first match line and the reference node; and
- a second comparison stage comprising:
  - a first inverter connected to the first pass transistor;
  - a second match line connected to the first inverter; and
  - a second base segment comparator connected between the second match line and the reference node.

2. The device of claim 1, wherein the second comparison stage further comprises:
- a second incremented segment comparator; and
- a second pass transistor, the second pass transistor and the second incremented segment comparator being connected in series between the second match line and the reference node.

3. The device of claim 1, wherein the second comparison stage further comprises:
- a second incremented segment comparator; and
- a least significant segment comparator, the least significant segment comparator and the second incremented segment comparator being connected in series between the second match line and the reference node.

4. The device of claim 1, wherein the first base segment comparator, the first incremented segment comparator, and the second base segment comparator are analog content addressable memory cells.

5. The device of claim 4, wherein each of the analog content addressable memory cells are configured to compare an input value to a stored threshold and output a match signal when the input value is greater than or equal to the stored threshold.

6. The device of claim 1, further comprising:
- a third comparison stage comprising:
  - a third match line;
  - a third incremented segment comparator connected between the third match line and the reference node;
  - a third base segment comparator; and
  - a second pass transistor, the second pass transistor and the third base segment comparator being connected in series between the third match line and the reference node; and
- a fourth comparison stage comprising:
  - a second inverter connected to the second pass transistor;
  - a fourth match line connected to the second inverter; and
  - a fourth incremented segment comparator connected between the fourth match line and the reference node.

7. The device of claim 6, further comprising:
- a first sense amplifier connected to the first match line;
- a second sense amplifier connected to the third match line; and an AND gate connected to the first sense amplifier and the second sense amplifier.

8. The device of claim 6, further comprising:

a third pass transistor connected between the fourth match line and the reference node; and a third inverter connected to the third pass transistor, the first match line connected to the third inverter.

9. A device comprising:

a lower bound comparison circuit comprising first comparison stages, each of the first comparison stages comprising a first match line and a first analog content addressable memory connected between the first match line and a reference node, wherein the first match lines of adjacent one of the first comparison stages are serially connected;

an upper bound comparison circuit comprising second comparison stages, each of the second comparison stages comprising a second match line and a second analog content addressable memory connected between the second match line and the reference node, wherein the second match lines of adjacent one of the second comparison stages are serially connected; and a combining circuit connected to the lower bound comparison circuit and the upper bound comparison circuit.

10. The device of claim 9, wherein the lower bound comparison circuit and the upper bound comparison circuit comprise recursive comparators.

11. The device of claim 9, wherein the combining circuit is configured to combine outputs from the lower bound comparison circuit and the upper bound comparison circuit in the digital domain.

12. The device of claim 9, wherein the combining circuit is configured to combine outputs from the lower bound comparison circuit and the upper bound comparison circuit in the analog domain.

13. The device of claim 9, wherein each of the first and second analog content addressable memories comprises a memristor configured to store a same predetermined number of bits.

14. The device of claim 9, wherein each of the first and second analog content addressable memories comprises a memristor, a first subset of the memristors are configured to store a first number of bits, and a second subset of the memristors are configured to store a second number of bits, the second number different from the first number.

15. The device of claim 9, wherein each of the first and second analog content addressable memories comprises a memristor configured to store a number of bits, the number of bits being in a range of three to four.

16. A method comprising:

partitioning a range into a plurality of bit segments, the range having a higher precision than the bit segments;

storing the bit segments in comparison stages, each of the comparison stages comprising a match line and an analog content addressable memory connected between the match line and a reference node, wherein the match lines of adjacent one of the comparison stages are serially connected;

partitioning an input value into a plurality of analog inputs; and comparing the analog inputs against the bit segments to determine whether the input value falls in the range.

17. The method of claim 16, wherein the bit segments have equal bit length.

18. The method of claim 16, wherein the bit segments have unequal bit length.

19. The method of claim 16, wherein the range comprises a lower bound and an upper bound, wherein the comparison stages comprise first comparison stages for the lower bound and second comparison stages for the upper bound, and the method further comprises:

combining results from the first comparison stages and the second comparison stages using a logical AND operation.

20. The method of claim 16, wherein the range comprises a lower bound and an upper bound, wherein the comparison stages comprise first comparison stages for the lower bound and second comparison stages for the upper bound, and the method further comprises:

combining results from the first comparison stages and the second comparison stages using an inverter and a pass transistor.

* * * * *